United States Patent

[11] 3,575,646

[72] Inventor Edmund A. Karcher
Palm Beach Gardens, Fla.
[21] Appl. No. 581,484
[22] Filed Sept. 23, 1966
[45] Patented Apr. 20, 1971
[73] Assignee Westinghouse Electric Corporation
Pittsburgh, Pa.

[54] INTEGRATED CIRCUIT STRUCTURES INCLUDING CONTROLLED RECTIFIERS
5 Claims, 15 Drawing Figs.

[52] U.S. Cl. 317/235, 307/205
[51] Int. Cl. H01l 11/10
[50] Field of Search 317/235/22, 235/41.1; 307/203, 205

[56] References Cited

UNITED STATES PATENTS

| | | | |
|---|---|---|---|
| 3,283,170 | 11/1966 | Buie | 317/235/22 |
| 3,309,537 | 3/1967 | Archer | 317/235/41.1 |
| 3,320,485 | 5/1967 | Buie | 317/235/22 |
| 3,327,182 | 6/1967 | Kisinko | 317/235/22 |
| 3,379,940 | 4/1968 | Nakao | 317/235 |

FOREIGN PATENTS

| | | | |
|---|---|---|---|
| 245,625 | 7/1965 | Austria | 317/235 |
| 1,418,640 | 10/1965 | France | 317/235 |

OTHER REFERENCES

ELECTRONICS, " Helpful transistor analog: 4-layer PNPN ≈ 2 transistors" by Stasior Aug. 10, 1964, pages 66— 73 307—205

SCP AND SOLID STATE TECHNOLOGY, " Integrated Circuit Device and Fabrication Technology" by Aarons, pages 42— 44 Mar. 1965

*Primary Examiner*—Jerry D. Craig
*Attorneys*—F. Shpoe, C. L. Menzemer and Gordon H. Telfer

ABSTRACT: Integrated circuit structures are provided wherein three of the regions of a four layer device, such as a controlled rectifier, are the same, in conductivity type, resistivity, and impurity concentration gradient, as the emitter, base, and collector regions of a bipolar transistor. The fourth region of the four layer device is provided by a region that may also be the same as a transistor base region entirely laterally spaced in the surface of the integrated circuit. Described are both structures with junction isolation and with dielectric isolation as well as methods for forming such structures. Means for avoiding parasitic transistor action in junction isolated structures, where such transistor action would detract from intended circuit operation, are also described.

INTEGRATED CIRCUIT STRUCTURES INCLUDING CONTROLLED RECTIFIERS

This application is directed to semiconductor controlled rectifiers, and their fabrication, wherein at least one of the elements is a semiconductor switch of a controlled rectifier type.

Controlled rectifier devices, sometimes known as thyristors, gate controlled switches, SCR's and SCS's, are known elements generally comprising a minimum of four semiconductive regions disposed to provide three junctions. Devices of the type referred to are characterized by three terminals including one on each of the outside regions for connection to the main or load circuit and a third terminal to one of the internal regions for control signals. Such devices exhibit a voltage-current characteristic exhibiting a region of high impedance and a region of hyperconductivity separated by a transition region of negative resistance. Available as single elements over a wide range of power levels, controlled rectifiers have found wide application as circuit elements.

While the discussion herein will be primarily directed to the description of integrated circuits providing controlled rectifiers it is to be understood that in its broader aspects the invention similarly relates to the integration of four layer diodes which in all respects relevant to the invention are the same as the controlled rectifier with the absence of the control electrode. For convenience, the term "controlled rectifier" will be generally employed herein.

For many circuit applications, a large number of low current, say less than about 1 ampere, controlled rectifiers are required and miniaturization of a multiple controlled rectifier unit would yield considerable space and weight saving as well as increase reliability. Toward this end single element, that is, nonintegrated, controlled rectifiers have been made of small size in a lateral-type structure wherein all three terminals may be applied to a single surface of a silicon die permitting greater flexibility in joining them into multielement arrays. There are not, however, provided the packing density and other advantages of the provision of a plurality of elements in a monolithic structure.

The integrated circuit art has developed to the point where a plurality of transistors, diodes, field effect devices, capacitors, and resistors may be provided with a unitary body of semiconductive material. At this stage in the art integrated circuit fabrication is keyed to the fabrication of bipolar transistor structures, that is, the individual operations performed and tailored to provide a bipolar transistor structure of desired characteristics in the integrated circuit are preferably, and almost necessarily as an economic matter, used for the simultaneous fabrication of the other types of elements in the integrated circuit so as to minimize fabrication time, expense and the extent and number of times to which the structure is required to be heated and handled and to minimize the number of individual process steps that require close control so as to realize a satisfactory overall yield.

It is naturally also the case that integrated structures should compete favorably as to engineering performance with single component circuits.

Because of the foregoing requirements, controlled rectifiers in integrated circuits have prior to the present invention, not been provided.

With integrated controlled rectifiers several problems are encountered which are not with discrete devices. The principal problem is current collection at the isolation junction in structures, as are presently in widespread use, providing isolation between elements by a PN junction. It is not, however, the case that current collection by the isolation junction is necessarily always bad. Special consideration to structural design must be given to the intended integrated circuit application so as to optimize the performance of the unit but yet have within the integrated circuit concept enough flexibility so that controlled rectifier structures can be provided where the extraneous current collection considerations differ.

It is an object of the present invention to provide integrated circuit structures that include controlled rectifiers operable with characteristics similar to discrete controlled rectifiers.

Another object is to provide integrated circuits including controlled rectifiers that may be made by fabrication techniques thoroughly compatible with those previously employed. Another object is to provide integrated circuits including controlled rectifiers employing design concepts wherein the amount of current collection by the isolation junction can be readily tailored to the intended circuit application.

The above-mentioned and additional objects and advantages of the invention are, briefly, achieved by this invention through the provision of integrated circuit structures wherein three of the controlled rectifier regions are the same, in conductivity type, resistivity and impurity concentration gradient as the emitter, base and collector regions of bipolar transistors in the integrated circuit. The fourth region may be provided by a region also the same as a transistor base region in the surface of the integrated circuit or by a region distinct from those in the bipolar transistor structure.

Where junction isolation is employed, current collection by the isolation wall (or substrate) can be effectively controlled as desired without degradation of other element parameters through (1) the provision of a buried layer between the controlled rectifier structure and the substrate corresponding in conductivity-type, resistivity and impurity concentration gradient to a buried collector region in bipolar transistor structures, (2) control of the minimum distance from the emitting region of the controlled rectifier structure from the isolation wall so as to avoid or minimize current carrier collection or (3) providing a wall of material that completely shields the isolation wall from the controlled rectifier elements.

The invention also provides methods of providing such structures that are consistent with existing fabrication technology. Additionally, the invention provides means of avoiding parasitic transistor action entirely by the employment of dielectric isolated structures wherein also elements of the controlled rectifier may be provided in the operations for forming bipolar transistor regions.

The above-mentioned and additional objects and advantages of this invention will be better understood by referring to the following description taken with the accompanying drawing wherein.

Figure 1:
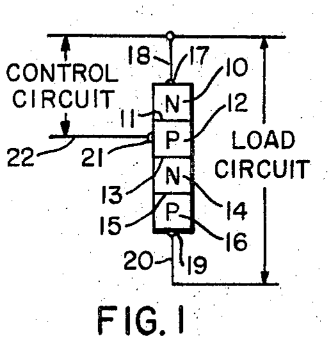
FIG. 1 is a schematic view of a single controlled rectifier.

As shown in FIG. 1, a controlled rectifier includes four successively disposed regions 10, 12, 14 and 16 of alternate conductivity type between each pair of adjacent regions of which are formed PN junctions 11, 13 and 15, respectively. Contacts 17, 19 and 21 are provided on regions 10, 16 and 12, respectively. It is to be understood, however, the contact to an internal region may, with suitable variation in the polarity of the applied control signals, be applied to the other internal region 14. Also, suitable four-layer diodes may be provided with no control contact at all. Leads 18 and 20 are provided in connection with contacts 17 and 19, respectively, for connection to a load circuit. A lead 22 is provided to the contact 21. A control circuit between leads 18 and 22 selectively actuates the controlled rectifier for controlled energization of the load circuit.

Figure 2:
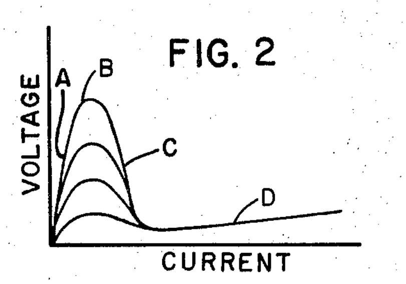
FIG. 2 is a typical voltage-current characteristic curve for a controlled rectifier.

FIG. 2 illustrates a typical characteristic curve for such a device including a high resistance portion *A* continuing up to a peak of maximum breakover point *B* following which there is a region of negative resistance *C* where the voltage drops with continued increase in current followed by a region *D* of hyperconductivity. Regions *A* and *D* are, respectively, the off and on states of the switching device.

Figure 3:
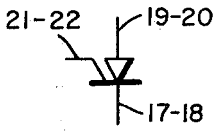
FIG. 3 is a symbol employed to represent a controlled rectifier.

FIG. 3 illustrates a symbol for controlled rectifiers that will be employed herein wherein the reference numerals are the same as for corresponding elements shown in FIG. 1.

Figure 4:
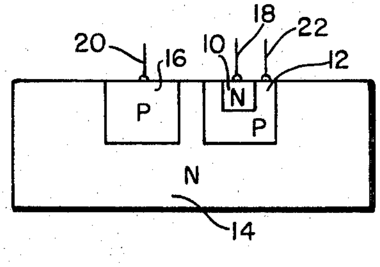
FIG. 4 is a sectional view illustrating a discrete, lateral, controlled rectifier.

FIG. 4 illustrates a lateral-type of controlled rectifier wherein the reference numerals are the same as those of the corresponding elements of FIG. 1. For convenience and clarity in illustration, FIG. 4 and subsequent FIGS. omit reference numerals on junctions and contacts.

Figure 5:
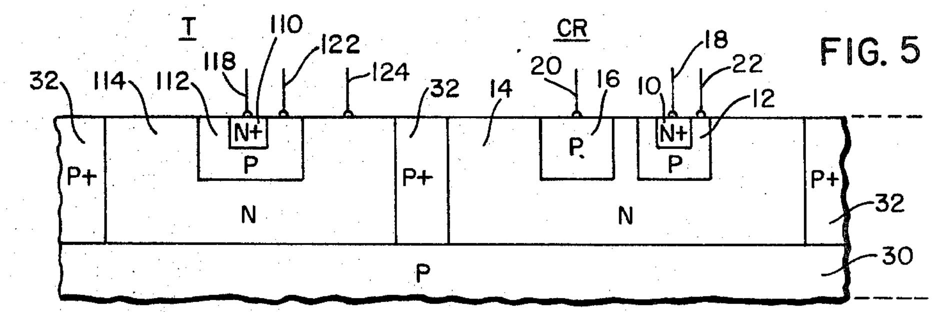
FIG. 5 is a partial, sectional view of a semiconductor integrated circuit in accordance with this invention illustrating a bipolar transistor element and a controlled rectifier element.

FIG. 5 illustrates an integrated structure including a transistor element T and a controlled rectifier element CR. For convenience, the elements of the controlled rectifier are designated by the same reference numerals as the corresponding elements of FIGS. 1 and 4. The structure includes a *p*-type substrate 30 on which regions of *n*-type material 14 and 114 are disposed separated by an isolation wall 32 of *p*+ material. In accordance with known technology regions 14 and 114 may be portions of an epitaxial layer formed on the starting material 30 through which the isolation wall 32 is provided by diffusion. Next, by the conventionally practiced base and resistance diffusion a bipolar base region 112 is formed in the *n*-type region 114, the latter serving as collector, and during the same operation two *p*-type regions are formed in the *n*-type region 14, the *p*-type regions being designated 12 and 16 and providing the two *p*-type regions of the controlled rectifier. During the emitter diffusion forming *n*+ region 110 in the base region 112, there is also formed an *n*+ emitter region 10 in the base region 12 of the controlled rectifier structure. Appropriate contacts and leads 18, 20 and 22 to the controlled rectifier and 118, 122 and 124 to the transistor are provided.

In the operation of the structure CR as a controlled rectifier, the *p*-type region 16 is employed as an emitter. Consequently, transistor action may be encountered wherein the junction between the isolation wall 32, or substrate 30, and the *n*-type region 14 acts as a collector junction. Thus, although the regions 10, 12, 14 and 16 constitute the intended four controlled rectifier regions, the regions 16, 14 and 32 (or 30) form a PNP transistor. Some portion of the current injected by region 16 may be collected by the isolation wall or substrate. The extent of such collection, that is, the current gain or alpha of the parasitic transistor formed by regions 16, 14 and 32 depend on the specific device structure. The degree to which this parasitic transistor action may be detrimental depends on the circuit function of the integrated structure.

Figure 6A:
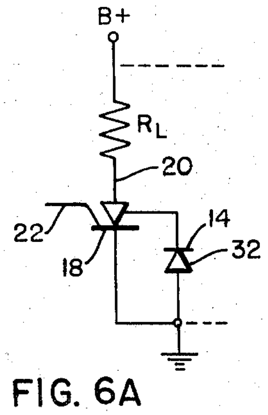
FIGS. 6A and 6B are schematic circuit diagrams illustrating one type of controlled rectifier application where isolation by junctions in integrated circuits is employed.

In a structure as illustrated in FIG. 5, either a large alpha or small alpha for the parasitic transistor may be desirable. FIG. 6A illustrates a circuit application for a controlled rectifier wherein the controlled rectifier, often employed in an array of parallel connected controlled rectifiers, is used in a grounded cathode configuration, that is, the *n*-type emitter region or terminal 18 of the controlled rectifier is grounded. In this instance substrate collection can be tolerated since the current collected passes through the load circuit and may lower the "on" state impedance of the device.

Figure 6B:
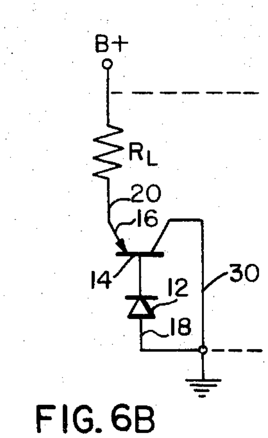

FIG. 6B illustrates the same elements as FIG. 6A redrawn so as to show the electrically equivalent circuit in terms of a transistor provided by the regions 16, 14 and 30 or 32.

Figure 7A:
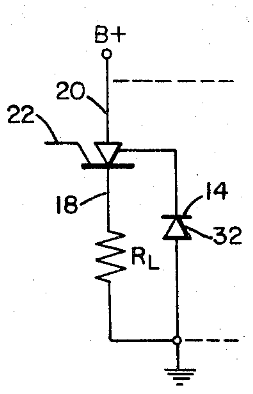
FIGS. 7A and 7B are schematic circuit diagrams illustrating another type of controlled rectifier application as effected by isolation junctions in integrated circuits.
Figure 7B:
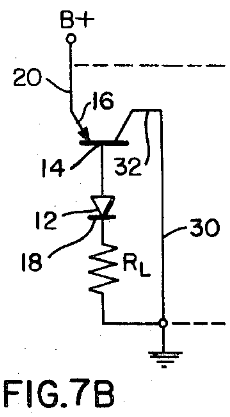

On the other hand, if the CR is connected in a common anode configuration with the load between the cathode and ground as shown in FIG. 7A, a potential equal to the supply voltage appears across the isolation junction, the diode formed by regions 14 and 32, when the CR is turned on and a relatively high power dissipation results from the substrate collection. FIG. 7B is a redrawing of the elements of FIG. 7A to show more clearly the parasitic transistor. In applications as shown in FIGS. 7A and 7B, a low alpha is desirable to minimize substrate power dissipation. In these various applications of controlled rectifiers in an integrated circuit the substrate 30 is grounded as is usual in integrated circuit practice. Reference numerals in FIGS. 6A, 6B, 7A and 7B are consistent with those in FIG. 5.

From the foregoing, it will therefore be understood that the configuration of FIG. 5 is satisfactory for some circuit applications, such as those of FIG. 6A while in applications as illustrated in FIG. 7A the structure of FIG. 5 would be undesirable.

Figure 8:
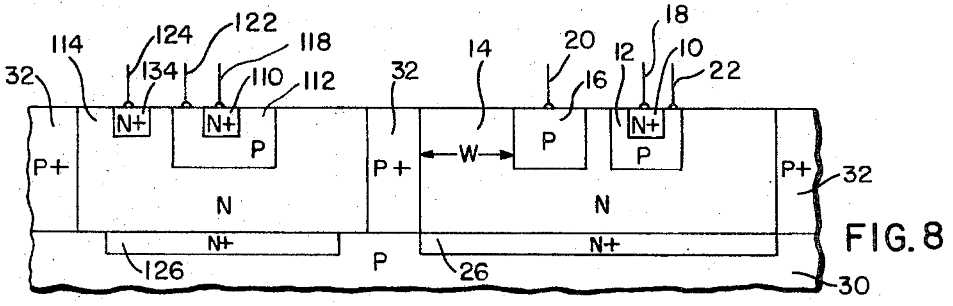
FIGS. 8, 9 and 10 are partial sectional views of semiconductor integrated circuits in alternative forms in accordance with this invention.

The invention provides several structures for integrated controlled rectifiers with minimal alpha in the parasitic transistor. In FIG. 8, where like elements are designated with like reference numerals as those in FIG. 5, an *n*+ region is provided beneath the region 14 in the controlled rectifier element and through its higher doping acts as a shield to prevent collection of carriers by the junction with the substrate. This region 26 may be formed simultaneously with the buried collector region 126 in the bipolar transistor portion. FIG. 8 also illustrates an *n*+ collector contact region 134 that may be formed at the same time as emitter region 110, as is conventional.

The region 26 effectively minimizes collector action with the substrate and thus reduces the alpha of the parasitic transistor. However, parasitic action can occur with the isolation wall 32 and where desired to minimize that transistor action it is preferred that the minimum spacing, *W*, between the emitter region 16 and the isolation wall 32 be made sufficiently large so as to minimize the probability of carriers flowing as far as the isolation wall. That is, the spacing *W* should be greater than the carrier diffusion length for further minimization of alpha and should be greater than the spacing between regions 12 and 16.

Figure 9:
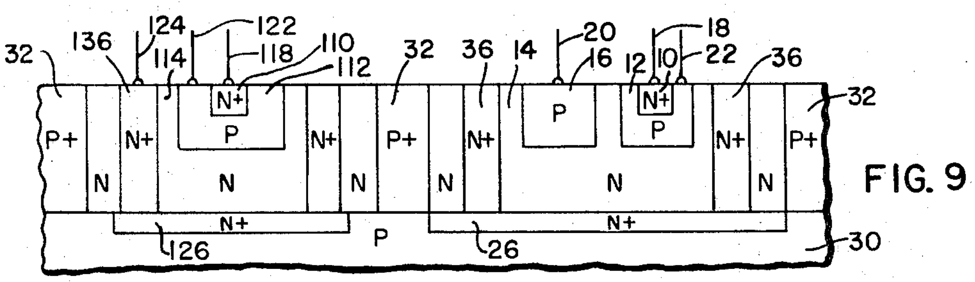

In FIG. 9, where reference numerals also are the same for elements as shown in the previous figure, additional means are employed to minimize the parasitic transistor action. Here, an *n*+ wall 36 extends from the surface of the integrated circuit down to the buried region 26 in the controlled rectifier element so as to provide complete shielding from the substrate and the isolation wall. The same diffusion to form the region 36 may be used for a collector wall 136 in the bipolar transistor portion in accordance with Husher et al., application, Ser. No. 353,524, filed Mar. 20, 1964, now U.S. Pat. No. 3,341,755.

The *n*+ subdiffused region 26 performs its shielding function by several mechanisms. First, the downward diffusion of the *n*+ region into the *p*-type substrate 30 increases the effective base width of the transistor formed by regions 16, 14 and 30. Also, the heavy concentration of donor impurities in the *n*+ region 26 decreases the lifetime for holes injected therein. Additionally, the injection efficiency for holes injected toward the substrate is minimized by the *n*+ background that the region 26 provides for the region 14.

In a typical fabrication sequence, thoroughly compatible with that presently employed, the *n*+ subdiffused region may be formed by diffusion of a donor impurity to a sheet resistivity of about 15±5 ohms per square and a depth of about 10 microns. The epitaxial layer from which the regions 14 and 114 are formed may have a thickness of typically 18±2 microns and a resistivity of 3±1.5 ohm centimeters. Isolation diffusion may be as presently employed. Base and resistance diffusion may be with an acceptor impurity to a sheet resistivity of about 250 ohms per square and a depth of about 3.6 to 4.5 microns. The spacing between regions 12 and 16 may suitably be 0.5 to 0.7 mil with a greater spacing between each of those regions and the isolation wall. The emitter diffusion may be conventionally employed to a depth so as to provide a base region width of 1.2 to 1.5 microns following which conventional metallization may be provided. In the drawing the conventional oxide diffusion mask and passivating layers have not been shown. Also, of course, the leads illustrated are merely representative of the conductive interconnections provided to the various regions in a typical integrated circuit, such interconnections normally being disposed on the ultimate passivating layer for the integrated circuit.

As a further modification, a $p+$ diffusion may be performed into the regions 16 and 12, and also in the transistor base region 112 if desired, for minimizing resistance. This reduces the controlled rectifier forward voltage although it increases the injection efficiency of layer 16 and the current collection at the isolation junction. When used this diffusion step would follow the base and resistance diffusion and have a typical sheet resistance of about 15 to 30 ohms per square.

Typically the lateral SCR device has a breakover voltage in excess of 50 volts however this can be increased by increasing the resistivity and width of the region 14 formed from the epitaxial layer. Whether or not the subdiffused region 26 is desired for the controlled rectifier element of course does not affect its employment in the bipolar transistor portion where it is essentially always desired for minimization of saturation resistance. A similar effect to that provided by the $n+$ subdiffused region may be achieved through the employment of an $n+$ epitaxial layer on the substrate through which the isolation wall would extend.

Figure 10:
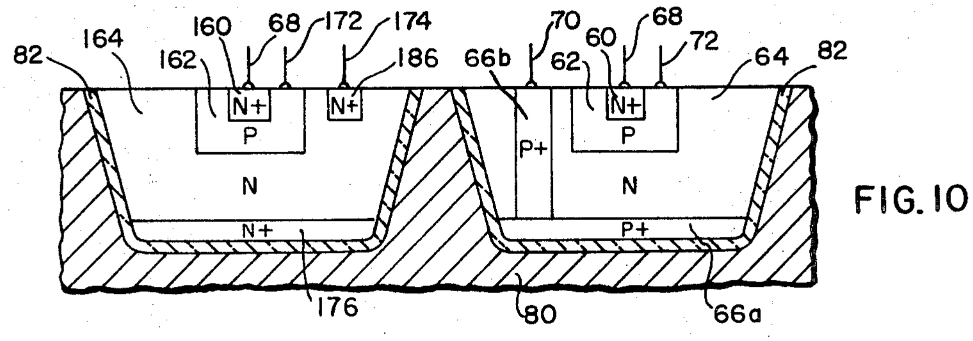

For total avoidance of the parasitic transistor action in the controlled rectifier structure, a structure like that of FIG. 10 may be formed. In FIG. 10 elements are designated by reference numerals that are greater by 50 than those employed in the previous structures for corresponding elements.

Here the isolation junction is completely avoided by utilizing a substrate 80 that is separated from the individual elements by a layer 82 of a dielectric material. Substrate 80 may be of polycrystalline silicon while the dielectric material may be silicon dioxide. In this instance a lateral-type controlled rectifier structure may be provided as in the other structures but with no danger of parasitic transistor action. Furthermore, a vertical-type controlled rectifier structure may be adequately provided which is not the case in the junction isolated structures. Here the region **66*a* is shown under the successively disposed regions 60, 62 and 64 in the controlled rectifier portion of the structure. A highly doped $p+$ region 66*b* extends from the surface for contacting the anode emitter region 66*a***.

Figure 11A:
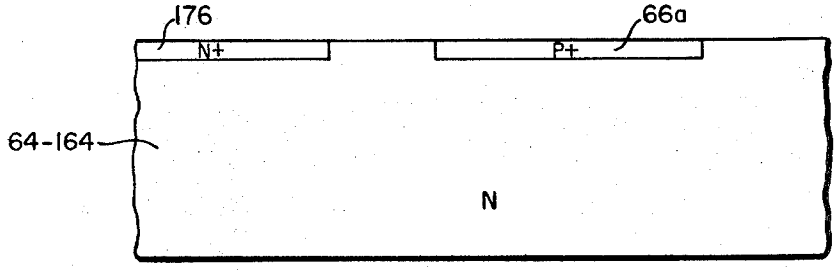
FIGS. 11A, 11B and 11C are partial sectional views of the structure of FIG. 10 at some stages in the fabrication process.
Figure 11B:
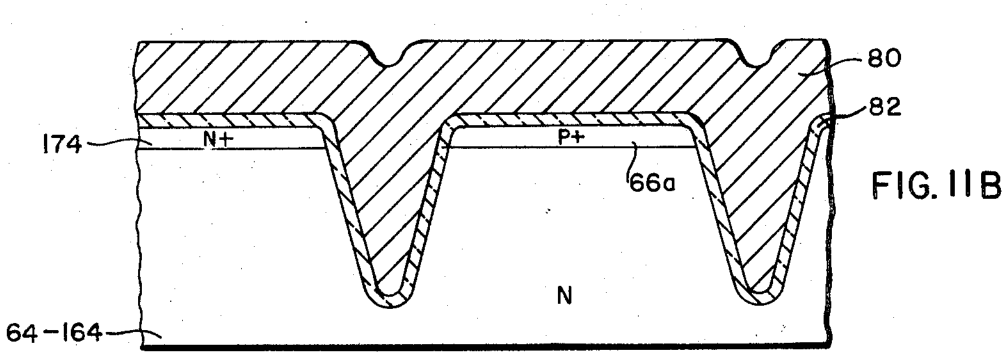
Figure 11C:
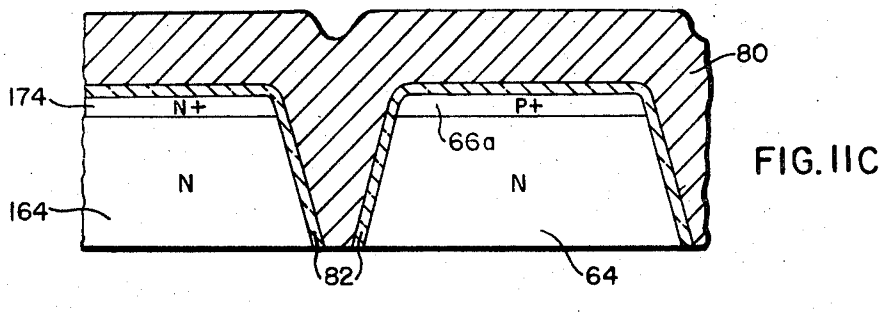

FIGS. 11A, 11B and 11C illustrate some of the steps taken to provide a structure like that of FIG. 10 which is patterned generally after known oxide isolation fabrication techniques. In FIG. 11A a substrate of starting material 64—164 is provided on one surface with selectivity diffused regions 174, which is $n+$, and **66*a* which is $p+$. In FIG. 11B the structure is shown after a few additional operations have been performed. First grooves are etched on a pattern coinciding with that desired for the isolation wall following which an insulating layer 82 is deposited or grown over the surface and etched groove. Then a material is deposited or grown over the insulating material such as by the deposition of polycrystalline silicon to form a substrate 80**.

As shown in FIG. 11C, the structure is etched and lapped back to the isolation grooves to provide the separated elemental portions of the epitaxial layer following which, by straightforward diffusion operations, the succeeding regions are formed including the provision of regions 62 and 162 in a single diffusion operation and the regions 160, 186 and 60 in a single diffusion operation.

The vertical controlled rectifier offers some advantages in that it takes advantage of a greater portion of the effective emitter surface area and should have a higher current capability for a device of given size. In accordance with known controlled rectifier techniques, a portion of the emitter junction between regions 60 and 62, or 10 and 12 in the other embodiments, may be shorted to reduce the sensitivity of the breakover characteristic to temperature.

In addition to excessive power dissipation through the parasitic transistor action there also occurs degradation of both the controlled rectifier blocking voltage capability and $dv/dt$ (anode to cathode voltage rise rate) rating in structures without features of the present invention as illustrated in FIGS. 8, 9 and 10.

Typical device characteristics of a structure as illustrated in FIG. 8 include a breakover voltage greater than 50 volts, under 1.8 volts forward voltage at 300 milliampere load current, under 0.2 milliampere gate current with a greater than 10 volts per microsecond $dv/dt$ rating at 150° C. case temperature. It is found that the characteristics generally obtainable with such structures are satisfactory in comparison with discrete controlled rectifiers.

By way of further example, structures as illustrated in FIG. 8 have been formed wherein the controlled rectifier provided the output switching function in a linear differential amplifier circuit. Such units were formed by planar, epitaxial, integrated circuit processing techniques on a silicon die having dimensions of 50 mils by 65 mils. About 330 such units were fabricated on a single 1.3 inch diameter silicon wafer. The starting material was 10 to 40 ohm-centimeters $p$-type silicon. The $n+$ regions 26 and 126 were formed by selective diffusion to a sheet resistivity of about 40 to 50 ohms per square. The epitaxial layer for regions 14 and 114 had a thickness of about 11.5±0.5 microns and a resistivity of 2.0±0.3 ohm centimeters. The base and resistance diffusion of $p$-type impurity was performed to a depth of 3.6±0.3 microns and a sheet resistivity of about 200 ohms per square ± 20 percent. The emitter diffusion is tailored to achieve required $h_{fe}$ for the bipolar transistor, leaving approximately 1 micron base width. Sheet resistivity for the emitter diffusion is 2±1 ohms per square. Passivation, diffusion, contacting and encapsulation were conventionally performed.

While the present invention has been shown and described in a few forms only it will be apparent that various changes and modifications may be made without departing from the spirit and scope thereof.

I claim:

1. A semiconductor integrated circuit comprising:

first and second portions of monocrystalline semiconductor material, said portions being physically united on a substrate with electrical isolation means between said portions;

an emitter region, a base region and a collector region in said first portion wherein said emitter and collector regions are of the same conductivity type and each forms a PN junction with said base region for providing bipolar transistor functions;

first, second and third regions in said second portion that have the same conductivity type, resistivity and impurity concentration gradient as said emitter, base and collector regions, respectively, in said first portion, said first and third regions each forming a PN junction with said second region;

and a fourth region in said second portion, distinct from said substrate and said isolation means, in PN junction forming relation with said third region for provision of controlled rectifier functions, said fourth region being entirely laterally spaced from said second region;

said transistor collector region and said third region each comprising a first portion of relatively high resistivity near the junction between said transistor collector and base regions, and the junctions between said third region and each of said second and fourth regions, respectively, and a lower resistivity portion spaced from said junctions;

said lower resistivity portion in said second portion substantially preventing transistor action between said fourth region and said substrate.

2. The subject matter of claim 1 wherein:

said fourth region is also a region having the same conductivity type, resistivity and impurity concentration gradient as said transistor base region.

3. The subject matter of claim 1 wherein:

said isolation means is a wall of material of the same conductivity type as said transistor base region extending between said transistor collector region and said third region in said second portion to a substrate also of the same conductivity type.

4. The subject matter of claim 3 wherein a predetermined spacing is provided between said second and fourth regions to permit transistor action therebetween and the spacing of said fourth region from said isolation wall is substantially greater than said predetermined spacing to effectively avoid transistor action therebetween.

5. The subject matter of claim 4 wherein:

said transistor collector region and said third region also comprise a wall of material extending to the surface of lower resistivity than the portion adjacent said junctions.